United States Patent [19]

Hayes et al.

[11] Patent Number: 5,103,094
[45] Date of Patent: Apr. 7, 1992

[54] COMPACT TEMPERATURE-COMPENSATED TUBE-TYPE SCANNING PROBE WITH LARGE SCAN RANGE

[75] Inventors: John B. Hayes; Jamshid Jahanmir; Eric M. Frey, all of Tucson, Ariz.

[73] Assignee: Wyko Corporation, Tucson, Ariz.

[21] Appl. No.: 694,827

[22] Filed: May 2, 1991

[51] Int. Cl.⁵ .............................................. G01N 23/00
[52] U.S. Cl. .................................... 250/306; 250/310; 250/311
[58] Field of Search ............... 250/306, 307, 309, 310, 250/311, 442.1

[56] References Cited

U.S. PATENT DOCUMENTS

| | | | |
|---|---|---|---|
| 4,343,993 | 8/1982 | Binnig et al. | 250/306 |
| 4,785,177 | 11/1988 | Besocke | 250/442.1 |
| 4,798,989 | 1/1989 | Miyazaki et al. | 310/328 |
| 4,841,148 | 6/1989 | Lydig et al. | 250/306 |
| 4,945,235 | 7/1990 | Nishioka et al. | 250/306 |
| 4,987,303 | 1/1991 | Takase et al. | 250/306 |
| 4,992,728 | 2/1991 | McCord et al. | 324/158 P |

FOREIGN PATENT DOCUMENTS 63-238503 10/1988 Japan .

OTHER PUBLICATIONS

"A Compact Scanning Tunnelling Microscope with Thermal Compensation", by Albrektsen et al., J. Phys. E. Sci. Instrum. 22 (1989), pp. 39-42.
"High-Stability Bimorph Scanning Tunnelling Microscope", by B. L. Blackford, D. C. Dahn, and M. H. Jericho, 1987 American Institute of Physics, Rev. Sci. Instrum. 58(8), Aug. 1987, pp. 1343-1348.

Primary Examiner—Jack I. Berman
Assistant Examiner—James E. Beyor
Attorney, Agent, or Firm—Cahill, Sutton & Thomas

[57] ABSTRACT

A scanning probe microscope includes a base, an inner piezoelectric tube, and an outer piezoelectric tube, with a first end of the outer piezoelectric tube connected to the base. A first end of the inner piezoelectric tube is rigidly connected to a second end of the outer piezoelectric tube. Thin inner conductors are disposed on the inner surfaces of the inner piezoelectric tube and the other piezoelectric tube, and quadrant conductors are disposed on the outer surfaces of the inner piezoelectric tube and the outer piezoelectric tube. Variable voltages are applied to the quadrant conductors of the outer piezoelectric tube and the inner piezoelectric tube and varied to cause lateral and axial movement of the second end of the outer piezoelectric tube and also to cause lateral and perpendicular movement of the second end of the inner piezoelectric tube relative to its first end. A probe having a tip is connected to the second end of the inner piezoelectric tube and scans the surface of a sample in response to the applied quadrant conductor voltages. A control system senses current or other parameter sensed by the tip of the probe and indicative of distance of the probe tip from the scanned surface to control application of the quadrant voltages.

20 Claims, 3 Drawing Sheets

COMPACT TEMPERATURE-COMPENSATED TUBE-TYPE SCANNING PROBE WITH LARGE SCAN RANGE

BACKGROUND OF THE INVENTION

The invention relates to temperature-compensated scanning probe microscopes (SPMs), particularly "tube scanner" type SPMs.

The prior art includes scanning tunneling microscopes (STMs) of the type shown in FIGS. 1 and 2. FIG. 1 shows an atomic resolution scanning tunneling microscope of the type developed by Binnig and Rohrer. The design shown in FIG. 1 is referred to as a "tripod design". Tripod "scanning heads" are known to have problems with thermal drift and interaction between the x, y, and z piezoelectric transducers 13, 14, and 15 as shown in FIG. 1. Actuation of one of piezoelectric transducers 13, 14, or 15 that is intended to produce movement of probe 11 (and atom 12 on the lower tip of probe 11) along its corresponding x, y, or z axis inevitably produces some movement along the other two axes. In FIG. 1, numeral 16 designates an article to be scanned, and numeral 17 designates electrons on the surface of article 16 which may "tunnel" up to atom 12 when atom 12 gets within approximately a few Angstroms of the immediately underlying feature of sample 16. This produces a current I which is sensed by a current measuring device 19. Numeral 20 indicates a bias voltage applied to probe 11 to produce the tunneling effect.

"Tube scanner" STMs were developed by Binnig and Smith. In these devices, a single piezoelectric cylindrical tube, with its outer electrode divided into four equal quadrants parallel to the tube's cylindrical axis, provides lateral scanning motion at a free end of the tube (the other end of the tube being stationary), by bending when voltages are applied to adjacent outside quadrants. The prior tube scanner device also produces lateral displacement along the z axis when a common voltage is applied to all four quadrant conductors relative to the grounded inner electrode of the tube. Such tube scanner designs suffer from thermal drift along the z axis. In order to achieve a long scan range, such prior art tube scanners have a large axial dimension and a low mechanical resonance frequency, and hence are subject to mechanical vibrations which make it much more difficult to accurately move the probe tip 11 over the surface 17, because low frequency vibrations inherently are of larger amplitude, and also are more easily excited than high frequency vibrations. Larger amplitude vibrations make it much more difficult to maintain a constant distance between the probe tip and the surface being scanned. Such prior tube-type scanners also are undesirably large.

The several Angstrom distance of the probe tip to the sampled surface is so small that any low frequency mechanical vibration makes it very difficult for the electronic feedback loop to permit accurate scanning or tracking of the probe tip over the surface features. Any large scanning tube inherently has a lower mechanical resonance frequency and consequently is more problematic in this respect than a physically smaller scan tube. Large scanning tubes also inherently are much more sensitive to thermal variations, the magnitude of which are proportional to physical size.

The problem of thermal sensitivity is addressed in U.S. Pat. No. 4,841,148 (Lyding), which discloses an STM that is thermally compensated by providing a pair of concentric piezoelectric tubes of the same length and composition. A tunneling probe is attached to a free end of the inner tube, which is divided into equal lateral quadrants for providing transverse and axial scanning motion. The sample holder 32 rests on two spaced rods 31 attached to the outer end of tube 25. Support element 32 supports test surface 17. The dimensions and thermal expansion coefficient of inner tube 26 and outer tube 25 are identical, so as to compensate for thermal variations in the lengths of both tubes. The distance between the tip of probe 11 and the surface 17 of the sample 16 is relatively unaffected by temperature variations of the piezoelectric tubes 25 and 26 because temperature-caused expansion and contraction of the inner and outer tubes in the directions of arrows 33 and 33A are equal.

The Lyding device provides no solution to the above-mentioned problems of achieving a large scan range unless a large structure that has low mechanical resonance frequencies is used. Consequently, the Lyding device is relatively unsuitable for achieving a large scan range. An STM of the Lyding design would need to have its piezoelectric tubes approximately three to six inches long in order to achieve a scan range of roughly 100 microns. Furthermore, it is designed for horizontal mounting only, and is totally unsuitable for vertical mounting because the technique for supporting the sample holder relies on gravity to hold sample holder 32 on rails 31.

There is an unmet need for an improved compact scanning probe microscope which is thermally compensated, provides large axial and lateral motion of a tube type scanning probe along a test surface, and avoids low mechanical resonance frequencies which interfere with accurate profiling.

SUMMARY OF THE INVENTION

Accordingly, it is an object of the invention to provide an improved compact temperature-compensated tube-type scanning probe microscope head with a large scan range.

It is another object of the invention to solve the problems of low mechanical resonance frequencies that interfere with profiling accuracy in the relevant prior art devices.

It is another object of the invention to provide a tube-type STM having the capability of a wide field of view in combination with a very fine or precise scan range within the field of view.

Briefly described, and in accordance with one embodiment thereof, the invention provides a scanning probe microscope including a base, an inner piezoelectric tube, and an outer piezoelectric tube. A first end of the outer piezoelectric tube is connected rigidly to the base. A first end of the inner piezoelectric tube is connected in fixed relationship to a second end of the outer piezoelectric tube. An inner conductor is disposed on the inner surface of each of the inner piezoelectric tube and the outer piezoelectric tube. Four quadrant conductors are disposed on the outer surface of each of the inner piezoelectric tube and the outer piezoelectric tube. A reference voltage is applied to the inner conductor of the outer piezoelectric tube and to the inner conductor of the inner piezoelectric tube. Various voltages are applied to the quadrant conductors, respectively, of the outer piezoelectric tube and the inner piezoelectric tube to cause lateral and axial movement of the second end of the outer piezoelectric tube and also to cause lateral and axial movement of the second end of the inner piezoelectric tube relative to its first end. A probe having a sensing tip is connected either to the second end of the inner piezoelectric tube or to a fixed support. A sample is connected to the other of a fixed support or the second end of the inner piezoelectric tube. Effective scanning of the surface of the sample by the probe then occurs in response to the applied quadrant conductor voltages. A control system measures current or other parameter(s) sensed by the sensing tip of the probe. The current or parameter(s) indicates the distance of the probe tip from the scanned surface for each value of x, y to control application of the quadrant voltages. The quadrant voltages represent the x, y, and z parameters of each point of the scanned surface, and hence the profile of the scanned surface. The structure disclosed is very compact and results in automatic compensation of drift in the expansion and bending of the inner and outer piezoelectric tubes due to temperature changes, increases the lateral scan range of the probe, and avoids profiling errors that result from low frequency mechanical oscillations.

DETAILED DESCRIPTION OF THE PREFERRED EMBODIMENT

Figure 1:
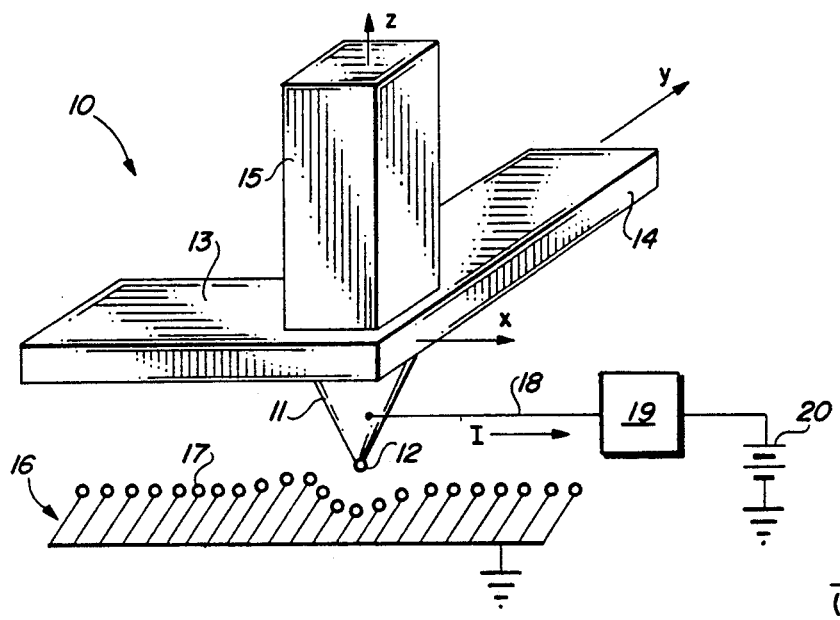
FIG. 1 is a perspective view diagram of a tripod type scanning tunneling microscope of the prior art.
Figure 2:
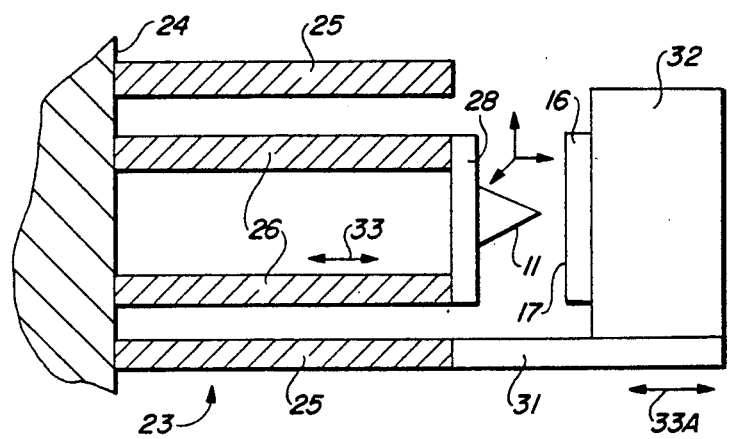
FIG. 2 is a section view diagram of a tube type prior art scanning tunneling microscope.
Figure 3:
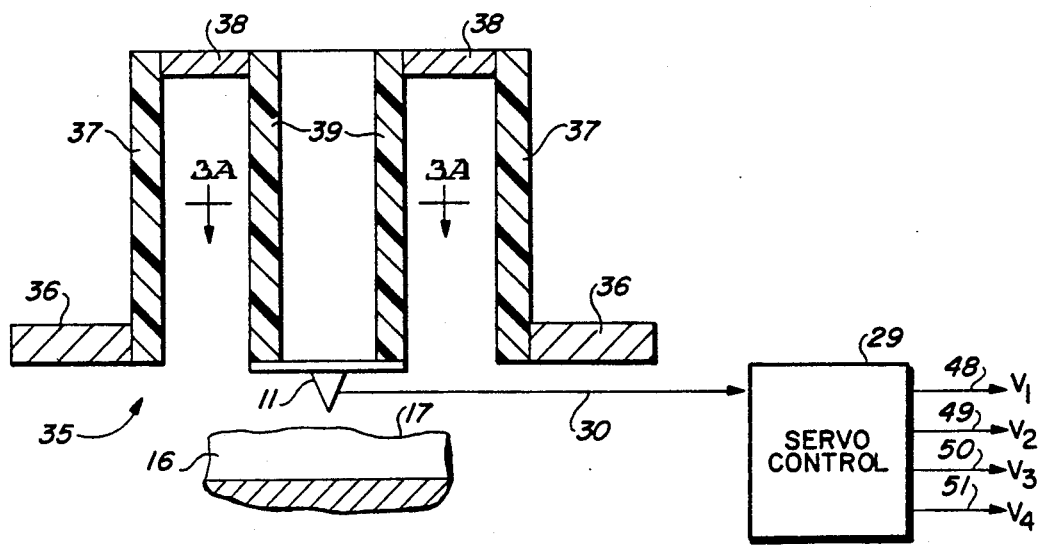
FIG. 3 is a section view of a scanning probe microscope of the present invention.
Figure 3A:
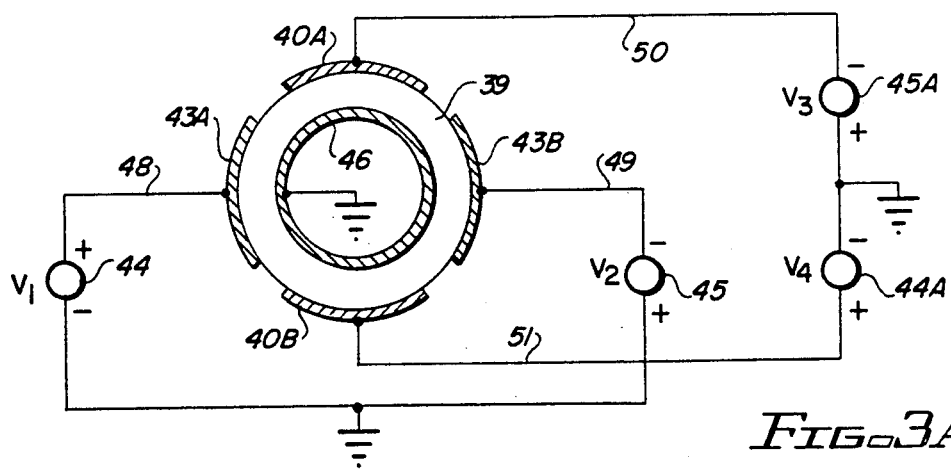
FIG. 3A is a section view taken along section line 3A—3A of FIG. 3.

Referring to FIGS. 3 and 3A, scanning probe microscope (SPM) 35 includes a fixed base 36. Base 36 is attached to the lower end of an outer piezoelectric tube 37. In one prototype that has been constructed and tested, the diameter of outer piezoelectric tube 37 is 0.5 inches, its length is 1.0 inches, and the wall thickness is approximately 0.030 inches. An annular collar 38 formed of MACOR ceramic is attached to the inner upper edge surface of piezoelectric tube 39, as illustrated. Collar 38 supports the upper end of an inner piezoelectric tube 39. In the prototype referred to above, the length of inner piezoelectric tube 39 is 1.0 inches, its outside diameter is 0.25 inches, and its wall thickness is approximately 0.030 inches. Piezoelectric tubes 37 and 39 are readily available from various companies, such as VERNATRON and STAVELEY SENSORS, INC.

A sensing probe 11 is attached to the lower end of inner piezoelectric tube 39, and senses a parameter (e.g., current, force, magnetic flux, light, etc.) that accurately indicates any change in the distance from the tip of probe 11 to the surface 17 of sample 16.

Referring to FIG. 3A, inner piezoelectric tube 39 has a continuous metal layer 46 coating its inner wall. Note that other embodiments of the invention may have the continuous metal layer coating on the inner wall of the piezoelectric tubes segmented, as shown by 40C and 40D in FIG. 3B, to further expand the scan range. Metal coating 46 can be nickel plating or the like, and may be electrically connected to a ground voltage, as shown. The outer surface of piezoelectric tube 39 is coated with four quadrant conductors 40A, 40B, 43A, and 43B which are located on diametrically opposed portions of the outer surface of piezoelectric tube 39. (For convenience of illustration, the quadrant conductors and inner conductors have been omitted from FIGS. 3 and 3B.) Quadrant conductors 43A and 43B are similarly diametrically opposed. Quadrant layers 40A,B and 43A,B can be nickel plating. The nickel electrodes are typically approximately 0.001 inches.

The diametrically opposed quadrant conductors can be attached to opposite polarity voltages. For example, in FIG. 3A, quadrant conductor 43A is connected to the positive terminal of voltage source 44, the negative terminal of which is connected to a ground conductor. Quadrant conductor 43B is connected to the negative terminal of a similar voltage source 45, the positive terminal of which is connected to the ground conductor. Quadrant conductors 40A and 40B are similarly connected to negative and positive voltage sources 45A and 44A, respectively. The voltage sources 44, 44A, 45, and 45A are continuously variable so as to produce either lateral or axial motion of probe tip 11 along the y and z axes. If the opposed voltage sources are varied in the same direction, rather than in opposite directions, vertical translation of the tip of probe 11 along the z axis is produced. (Alternatively, FIG. 3C shows how a single voltage source 45A can apply the same voltages in the same opposite polarities across opposite portions of the wall material of tube 39 as is accomplished by two equal voltage sources connected as shown in FIG. 3A.)

Conductor 30 in FIG. 3 conducts a signal representative of the current or other parameter sensed by probe 11 to a feedback control system 29. In response to that signal, control system 29 varies the voltages V1, V2, V3, and V4 on conductors 48, 49, 50, and 51, respectively, to adjust the z axis value or distance from the tip of probe 11 to the surface 17 for the present x,y coordinates. Likewise, control system 29 also varies the x and y coordinates to scan the surface 17 within the scan range of SPM 35.

Figure 3B:
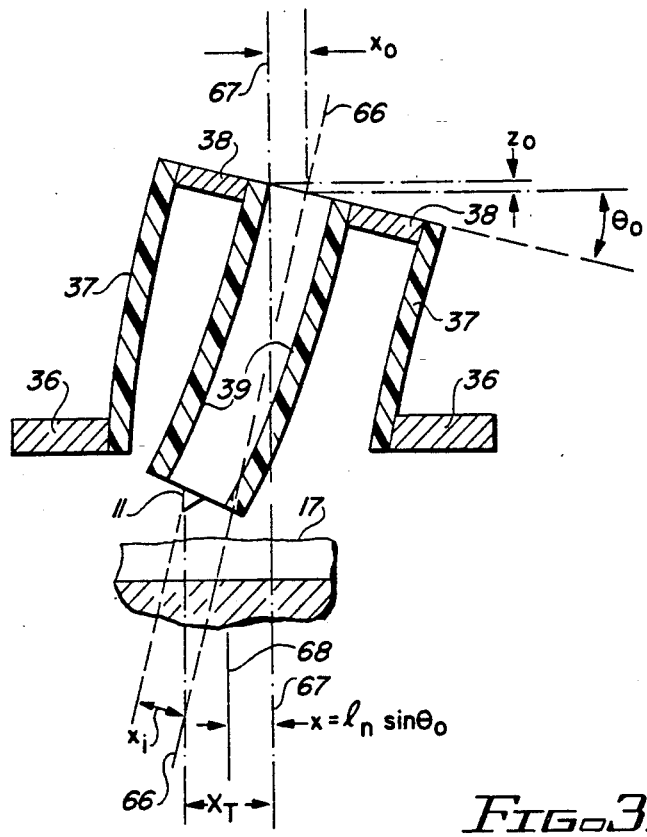
FIG. 3B is a diagram useful in describing the operation of the scanning probe microscope of FIG. 3.
Figure 3C:
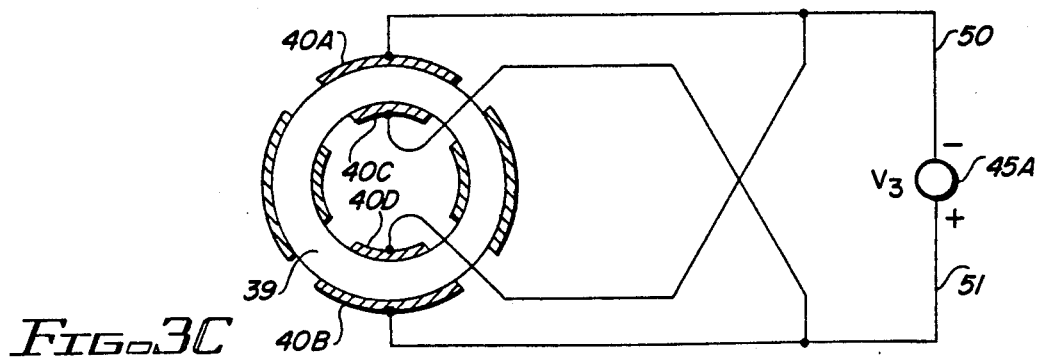
FIG. 3C is a diagram of a modification of the structure and operation illustrated in FIG. 3A.

FIG. 3B illustrates how piezoelectric tubes 37 and 39 can be deflected by appropriately applied quadrant voltages to produce lateral movement of probe tip 11 in the x, y, and z directions to achieve a large scan range.

As is apparent from FIG. 3B, probe tip 11 is subjected to tilt when the quadrant electrodes are electrically driven to produce sideways deformations of the inner and outer piezoelectric tubes 37 and 39 as shown. What is not apparent, however, is that various combinations of applied quadrant electrode voltages in opposite directions so as to produce deflection of piezoelectric tubes 37 and 39 generally as indicated results in lateral movement of the tip of probe 11 in an x,y plane. Vertical movement of the tip of probe 11 along the z axis is produced by varying the quadrant voltages in the same, rather than opposite directions. It has been found that the tilt is unimportant for most scanning purposes.

The transverse and axial translation of the lower end of inner tube 39 are given by the following equations. The transverse displacement of the probe 11 from the axis 66 in FIG. 3, which is the longitudinal axis of the uppermost undeflected part of inner tube 39, is $x_i$. The transverse displacement of the upper end of outer tube 37 relative to axis 67, which is the cylindrical axis of the lower undeflected portion of outer tube 37, is $x_o$. The total translation of the lower end of inner tube 39 relative to axis 67 and fixed base 36 is $x_T$, and represents the total travel of the probe 11 or other device attached to the lower end of inner tube 39. Both $x_i$ and $x_o$ can be computed according to the expression $$x_n = \frac{D_n \omega_n}{2 d_n V_n} \left[ 1 - \cos\left(\frac{2 l_n d_n V_n}{D_n \omega_n}\right)\right] - \frac{l_n^2 d_n V_n (\pi - 2)}{D_n \omega_n (\pi + 2)}, \quad (1)$$

where n can be either i (inner) or o (outer), $D_n$ is the tube diameter, $\omega_n$ is the tube wall thickness, $l_n$ is the tube length, and $d_n$ is the piezoelectric strain coefficient. The quantities $x_i$ and $x_o$ and also $x_T$ are shown in FIG. 3B. The dimensions $\theta_o$, $z_i$, and $z_o$ also are shown in FIG. 3B. The expression $x_T$ is given by the equation $$x_T = x_i \cos\theta_o + l_n \sin\theta_o - x_o, \quad (2)$$

where $l_n$ is the length of both outer piezoelectric tube 37 and inner piezoelectric tube 39. The portion $l_n \sin\theta_o$ of equation (2) corresponds to the distance indicated in FIG. 3B between axes 67 and 68, where axis 68 is the location of probe 11 with outer tube 37 deflected as shown and inner tube 39 undeflected.

$\theta_o$ is given by the expression $$\theta_o = \frac{2 l_n d_0 V_o}{D_0 \omega_0}, \quad (3)$$

where $V_o$ is the value of the equal and opposite voltages applied across opposite segments of the wall of outer piezoelectric tube 37 to cause it to deflect to the angle $\theta_o$.

The vertical translation $z_i$ or $z_o$ is given by the equation $$z_n = l_n \left[ 1 - \frac{D_n \omega_n}{2 l_n d_n V_n} \sin\left(\frac{2 l_n d_n V_n}{D_n \omega_n}\right)\right], \quad (4)$$

where $v_n$ is the value of the equal voltages applied across opposite segments of the wall of the piezoelectric tube under consideration to cause it to expand axially, n being equal to i for inner tube 39 and o for outer tube 37.

The total axial translation is given by the equation $$z_T = z_i - z_o + l_n(l - \cos\theta_o). \quad (5)$$

The temperature compensation can be achieved by making outer piezoelectric tube 37 and inner piezoelectric tube 39 of the same material and same length. Alternately, if the piezoelectric materials of the inner and outer tubes are different, the resulting different sensitivities to applied quadrant conductor voltages can be compensated for by making the length of inner piezoelectric tube 39 correspondingly greater or less than the length of outer piezoelectric tube 37.

Figure 4:
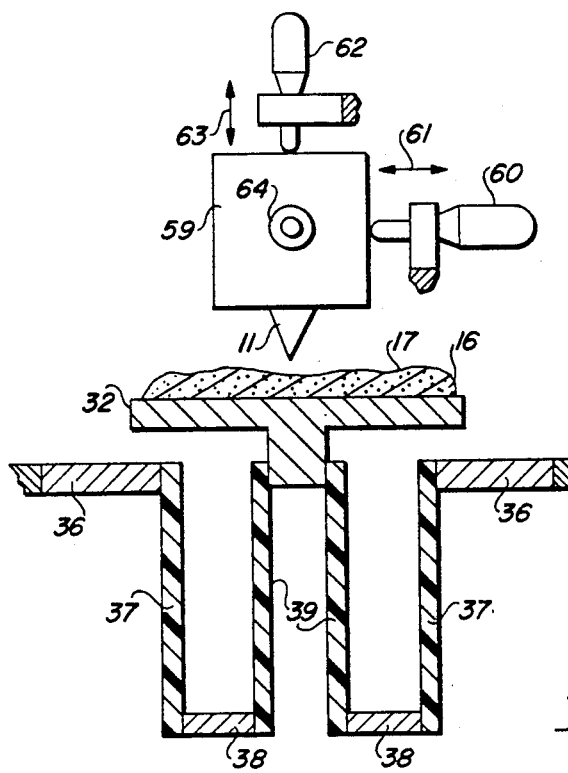
FIG. 4 is a diagram of an alternate embodiment of the scanning probe microscope in which the locations of the probe and sample are reversed.

Referring to FIG. 4, which shows an alternate embodiment of the SPM shown in FIG. 3, the inner piezoelectric tube 39 and outer piezoelectric tube 37 are inverted so that they extend below fixed base 36. The probe 11 is attached to the bottom of a micrometer adjustable head 59. Head 59 can be manually coarsely adjusted in the x, y, and z directions by means of conventional micrometers 60, 62, and 64. Micrometer 60 varies the position of probe 11 in the x direction as indicated by arrows 61, and micrometer 62 adjusts probe 11 in the z direction as indicated by arrow 63. Micrometer 64 adjusts probe 11 in the y direction, which is perpendicular to the page of the illustration. Sample 16 is mounted on the upper end of inner piezoelectric tube 39 by means of a sample holder 32.

If the probe is difficult to move, the foregoing embodiment of the invention provides the advantages of moving the sample 16 instead of probe 11.

Figure 5:
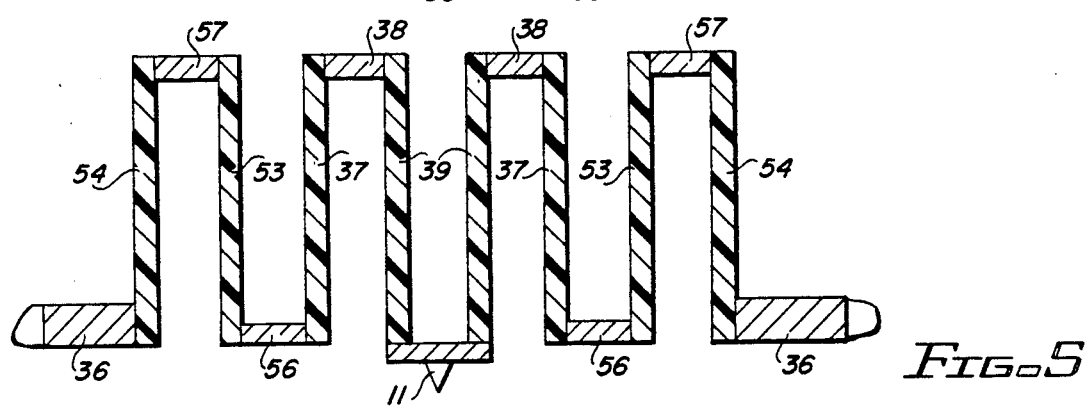
FIG. 5 is a drawing of an another alternate embodiment with additional "nested" pairs of cylindrical piezoelectric transducers, resulting increased scan range.

Referring to FIG. 5, the scan range of the embodiment of either FIG. 3 or FIG. 4 can be doubled by "nesting" piezoelectric tubes 37 and 39 within another pair of concentric piezoelectric tubes 53 and 54. The lower end of piezoelectric tube 53 is connected to the lower end of piezoelectric tube 37 by annular collar 56. The upper end of piezoelectric tube 53 is connected to the upper end of piezoelectric tube 54 by annular collar 57. The lower end of piezoelectric tube 54 is connected to base 36. The scan range can be further increased by adding yet more pairs of piezoelectric tubes in a similar fashion.

The feedback system including conductor 30, servo control circuit 29, controlled voltage sources $V_1$, $V_2$, $V_3$, and $V_4$, and the various outer segment conductors operate to control the position of probe 11 by sensing the position of the tip of probe 11 and by applying a voltage to the PZT translating device to keep the tip of probe 11 a constant distance from sample surface 17. The probe tip position is detected by using an electronic or optical signal that varies in accordance with the distance of the probe tip 11 from surface 17. For example, an STM (scanning tunneling microscope) uses a feedback signal produced by electrons tunneling between surface 17 and the tip of probe 11. The amount of current varies exponentially with the distance between the tip of probe 11 and surface 17. The feedback circuit senses the current and retracts the tip of probe 1 when the current exceeds a preselected threshold value The tip of probe 11 is moved toward surface 17 when the current decreases, so the tip of probe 11 is kept at a constant distance from surface 17 during transverse scanning.

Figure 6:
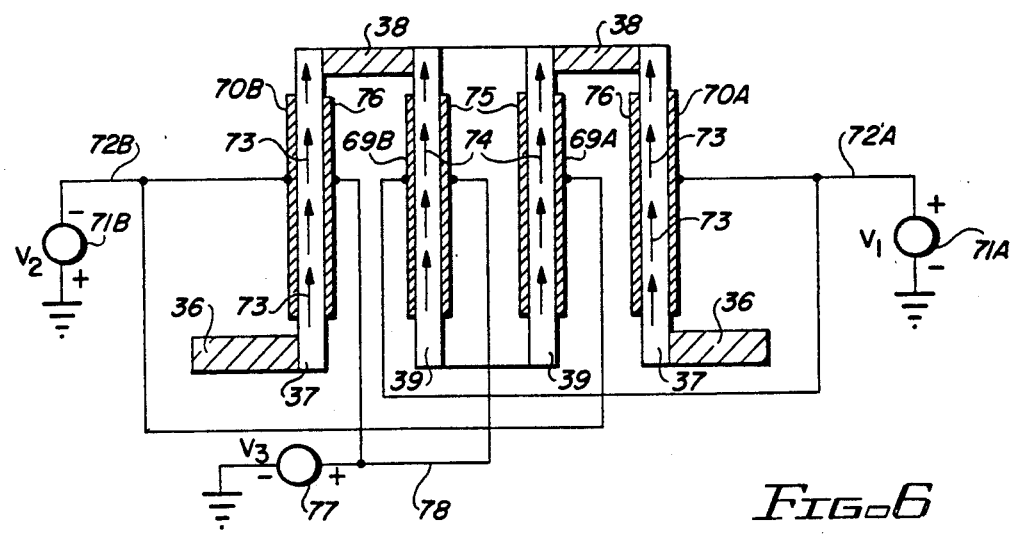
FIG. 6 is a perspective diagram illustrating opposed polarization of materials of the inner and outer scanning tubes.

Referring to FIG. 6, piezoelectric tubes 37 and 39 typically are composed of ceramic material which can be "polarized" by suitable application of high voltages across the ceramic material. If the material is polarized in one direction, subsequent application of a particular control voltage across the wall of the tube causes the ceramic piezoelectric material to expand along the length of the tube wall. However, if the ceramic piezoelectric material is polarized in the opposite direction by application of a suitable polarizing voltage, then application of the control voltage across the wall of the tube results in contraction of the ceramic material along the length of the wall. In FIG. 6, voltage source 71A applies a voltage $V_1$ via conductor 72A to outer conductive segment 70A on the right hand side of outer tube 37 and to conductive segment 69B on the outer left hand side of inner tube 39. Similarly, voltage source 71B applies voltage $-V_2$ via conductor 72B to conductive segment 70B on the outer surface of the left side of outer tube 37 and to conductive segment 69A on the outer surface of the right hand side of inner tube 39. Voltage source 77 applies voltage $V_3$ via conductor 78 to the continuous cylindrical inner conductor 76 on the inner surface of outer tube 37 and to the cylindrical continuous conductor 75 on the inner surface of inner tube 39.

In FIG. 6, the material of outer tube 37 has been polarized in one direction so as to cause axial expansion of outer tube 37 in the upward direction as indicated by the upward-pointing arrows 73 if, for example, $V_3$ is increased. The material of inner tube 39 has been polarized in the opposite direction so as to simultaneously cause contraction of inner tube 39 in the direction of the upward-pointing arrows 74 as $V_3$ is increased. It can be readily seen that increasing the magnitude of the voltages $V_1$ and $V_2$ produces transverse deflection of outer tube 37 and inner tube 39 in one direction, in the manner generally indicated in FIG. 3B.

The above-described temperature-compensated scanning probe head has a number of significant advantages over the Lyding design. The SPM scanning head of the present invention is mechanically very small, for example, as small as about one inch long. Also, its scan range can be as much as approximately 200 microns, which is two to ten times greater than that achievable with the prior art.

The present invention distinguishes over the Lyding device in that Lyding uses the outer piezoelectric tube primarily for translation of the sample and uses the inner piezoelectric tube to perform all of the scanning functions. Lyding's temperature compensation is achieved by mounting both the probe tip and the sample to separate piezoelectric tubes of the same length and material anchored to the same support. In contrast, the present invention anchors only one end of the outer piezoelectric tube to a stationary support.

There are many other types of scanning probes other than scanning tunneling mechanisms for atomic resolution "microscopy". For example, some types of probes measure atomic force, others measure magnetic forces. Others measure temperature changes. Optical probes or electrical force probes also may be used. The above-described scanning probe head can be utilized in conjunction with any of these.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, a conductor such as 30 could be used to energize a control probe 11 or a transducer, emitter, laser beam, or the like coupled to the bottom of tube 39 effectuate precisely controlled changes of surface 17. The tilting of the bottom of inner piezoelectric tube 39 due to bending of piezoelectric tubes 37 and 39 could be used to mechanically control an element, such as a beam steering mirror. The lateral translation of the bottom of inner piezoelectric tube 39 could be used to precisely control a mechanical element or operation. It is desirable to be able to control outer tube 37 to effectuate coarse adjustment or a large scan range and to control inner tube 38 to effectuate fine adjustment or a small scan range. One way of effectuating this is to provide the segmented control conductors such as 40A, 40B, etc. around only a relatively narrow band portion of inner tube 39 to reduce the amount of transverse and/or axial translation of the lower end of inner tube 39 relative to its upper end in response to a particular applied voltage change.

What is claimed is:

1. A scanning probe microscope comprising in combination:
   (a) a base;
   (b) an inner piezoelectric tube and an outer piezoelectric tube, the outer piezoelectric tube having a first end portion connected to said base;
   (c) means disposed on a second end of the outer piezoelectric tube and extending to a first end of the inner piezoelectric tube for supporting the first end of the inner piezoelectric tube in fixed relationship to the second end of the outer piezoelectric tube;
   (d) a probe having a tip, the probe being connected to one of a second end of the inner piezoelectric tube and a fixed support;
   (e) a sample connected to the other of the second end of the inner piezoelectric tube and the fixed support to effectuate scanning by the probe tip relative to a surface of the sample;
   (f) means for applying selected voltages to conductive surfaces, respectively, on one of the outer and inner surfaces of the outer piezoelectric tube and conductor means for applying selected voltages to conductive surfaces, respectively, on the inner piezoelectric tube to cause three-dimensional movement of the scanning probe.

2. The scanning probe microscope of claim 1 wherein the base is fixed and the inner and outer piezoelectric tubes are cylindrical.

3. The scanning probe microscope of claim 2 wherein the inner and outer piezoelectric tubes are of the same length and are composed of the same material.

4. The scanning probe microscope of claim 2 wherein the inner and outer piezoelectric tubes are of different lengths.

5. The scanning probe microscope of claim 2 wherein the inner and outer piezoelectric tubes are composed of different materials.

6. The scanning probe microscope of claim 1 wherein the supporting means includes an annular ring coaxially located with respect to and connected to the second end of the outer piezoelectric tube and the first end of the inner piezoelectric tube.

7. The scanning probe microscope of claim 1 wherein the probe is connected to the second end of the inner piezoelectric tube and the sample is connected to the fixed support.

8. The scanning probe microscope of claim 1 wherein the probe is connected to the fixed support and the sample is connected to the second end of the inner piezoelectric tube.

9. The scanning probe microscope of claim 1 wherein the conductive surfaces include pairs of opposed conductive surfaces, the scanning probe microscope including means for varying the voltages applied to the opposed conductive surfaces of the inner and outer piezoelectric tubes in the same polarity directions to produce axial movement of the second end of the inner piezoelectric tube and in opposite polarity directions to produce transverse movement of the second end of the inner piezoelectric tube.

10. The scanning probe microscope of claim 1 including means for converting the voltages to spatial coordinates and storing the spatial coordinates to produce a profile of a surface of the sample.

11. The scanning probe microscope of claim 1 wherein the probe is of a type selected from the group consisting of atomic force probes, magnetic probes, electric field probes, tunneling probes, thermal probes, and optical probes.

12. The scanning probe microscope of claim 1 including feedback control means coupled to the probe for controlling the voltages in response to a signal produced by the probe and representative of the distance of the tip of the probe from a surface of the sample.

13. The scanning probe microscope of claim 1 wherein the inner piezoelectric tube is composed of piezoelectric material that is polarized in a first direction, and the outer piezoelectric tube is composed of piezoelectric material that is polarized in a second direction, the voltage applying means applying a common control voltage to a first conductor on a first portion of the inner piezoelectric tube and a second conductor on a second portion of the outer piezoelectric tube, the first portion being adjacent to the second portion, the common control voltage causing one of the first and second portions to expand and the other of the first and second portions to contract, whereby a single control voltage causes additive displacements of the inner and outer piezoelectric tubes.

14. A method of operating a scanning probe microscope, including a base, an inner piezoelectric tube, and an outer piezoelectric tube, the method comprising the steps of:
  (a) rigidly connecting a first end of the outer piezoelectric tube to said base;
  (b) supporting the first end of the inner piezoelectric tube in fixed relationship to a second end of the outer piezoelectric tube;
  (c) supporting a probe on one of a second end of the inner piezoelectric tube, and a stationary support, the probe having a tip;
  (d) supporting a sample on the other of the second end of the inner piezoelectric tube and the stationary support;
  (e) applying selected voltages between conductive surfaces on the inner and outer surfaces of the outer piezoelectric tube and an inner piezoelectric tube, respectively, to cause transverse and axial movement of the scanning probe relative to the sample surface.

15. The method of claim 14 wherein step (c) includes supporting the probe on the second end of the inner piezoelectric tube and step (d) includes supporting the sample in fixed relationship to the stationary support.

16. The method of claim 14 wherein step (c) includes supporting the probe on the stationary support and step (d) includes supporting the sample on the second end of the inner piezoelectric tube.

17. A scanning mechanical translation device comprising in combination:
  (a) a base;
  (b) an inner piezoelectric tube and an outer piezoelectric tube, the outer piezoelectric tube having a first end portion connected to said base;
  (c) means disposed on a second end of the outer piezoelectric tube and extending to a first end of the inner piezoelectric tube for supporting the first end of the inner piezoelectric tube in fixed relationship to the second end of the outer piezoelectric tube;
  (d) a utilization device connected to a second end of the inner piezoelectric tube;
  (e) conductor means for applying selected voltages to various conductive surfaces on an outer surface of the outer piezoelectric tube and an inner piezoelectric tube, respectively, to cause movement of the utilization device.

18. The scanning mechanical translation device of claim 17 including means for adjusting the voltages so as to produce transverse movement of the utilization device.

19. The scanning mechanical translation device of claim 17 including means for adjusting the voltages so as to produce axial movement of the utilization device.

20. The scanning mechanical translation device of claim 17 including means for adjusting the voltages so as to cause tilting of the utilization device.

* * * * *